United States Patent
Yamashita

[19]
[11] Patent Number: 6,115,293
[45] Date of Patent: Sep. 5, 2000

[54] NON-VOLATILE SEMICONDUCTOR MEMORY DEVICE

[75] Inventor: Minoru Yamashita, Kawasaki, Japan

[73] Assignee: Fujitsu Limited, Kawasaki, Japan

[21] Appl. No.: 09/419,066

[22] Filed: Oct. 15, 1999

[30] Foreign Application Priority Data

Oct. 16, 1998 [JP] Japan ................................. 10-295498

[51] Int. Cl.[7] .................................................. G11C 7/00
[52] U.S. Cl. ............................... 365/185.9; 365/185.18; 365/185.21; 365/185.24
[58] Field of Search ........................ 365/185.09, 185.15, 365/185.01, 185.21, 185.24

[56] References Cited

U.S. PATENT DOCUMENTS

| | | | |
|---|---|---|---|
| 5,754,010 | 5/1998 | Caravella et al. | 365/203 |
| 5,818,761 | 10/1998 | Onakado | 365/185.18 |
| 5,999,454 | 12/1999 | Smith | 365/185.21 |
| 6,005,802 | 12/1999 | Takeuchi | 365/185.02 |
| 6,038,167 | 3/2000 | Miwa et al. | 365/185.03 |
| 6,041,012 | 3/2000 | Banba et al. | 365/226 |

FOREIGN PATENT DOCUMENTS

| | | |
|---|---|---|
| 40189278 | 2/1994 | Japan . |
| 7-272490 | 10/1995 | Japan . |
| 8-509091 | 9/1996 | Japan . |

*Primary Examiner*—Viet Q. Nguyen
*Attorney, Agent, or Firm*—Arent Fox Kintner Plotkin & Kahn, PLLC

[57] ABSTRACT

A non-volatile semiconductor memory device includes a first cell including a first floating-gate type transistor having a first threshold voltage, and a second cell including a second floating-gate type transistor having a second threshold voltage different from the first threshold voltage. Data is stored by a difference between a first current flowing in the first cell and a second current flowing in the second cell.

13 Claims, 6 Drawing Sheets

FIG. 6

|  | Vcg1 | Vcg2 | CAM_VSS | PGM |
|---|---|---|---|---|
| READ | 0 V | 0 V | 0 V | 0 V |
| PROGRAM | ≑10V | 0 V | 0 V | H |
| ERASE | 0 V | 0 V | ≑10V | 0 V |

Vpp≑10V

NON-VOLATILE SEMICONDUCTOR MEMORY DEVICE

BACKGROUND OF THE INVENTION

Field of the Invention

The present invention generally relates to non-volatile semiconductor memory devices, and more particularly to a non-volatile semiconductor memory device using a programmable and erasable floating-gate type memory cell. More specifically, the present invention is concerned with a non-volatile semiconductor memory device using floating-gate type memory cells as redundant information memory elements.

There is a demand to reduce the operation voltage in order to suppress power consumed in various semiconductor devices as portable devices are widely used in practice. Particularly, non-volatile semiconductor memory devices such as flash memories are equipped with programmable and erasable memory cells of the floating-gate type are required to reduce the threshold voltage of the memory cells to of a power supply voltage approximately equal to 1.5V.

A description will now be given, with reference to FIG. 1, of a conventional non-volatile semiconductor memory device.

FIG. 1 shows a structure of a peripheral circuit of a floating-gate type memory cell used in a conventional non-volatile semiconductor memory device. The peripheral circuit includes a floating-gate type memory cell 101, p-channel transistors 102 and 104, and an inverter 103. The memory cell 101 has a polysilicon gate embedded in a gate oxide film. The memory cell 101 can be programmed by applying a high voltage equal to, for example, 12 V or 21 V. Thus, electrons are injected into the polysilicon gate of the cell 101. The electrons can be drawn from the polysilicon gate by applying another high voltage, so that data stored in the memory cell can be erased. The threshold voltage of the memory cell is varied in accordance with the voltage applied to the polysilicon gate thereof.

A description will be given of a programming operation, an erase operation and a data read operation of the conventional non-volatile semiconductor memory device, assuming that the threshold voltage of the memory cell transistor is approximately equal to 2 V when there are no electrons in the gate (the initial state) and is approximately equal to 5 V when there are electrons in the gate.

In the programming operation, the threshold voltage of the memory cell cell 101 can be increased to 5 V or higher as follows. A control gate voltage Vcg as high as approximately 10 V is applied to the control gate of the memory cell cell 101. A drain voltage Vd which is as high as approximately 5 V and results from a programming voltage Vpgm is applied to the drain (Nb) of the memory cell cell 101. A source voltage Vs of 0 V is applied to the source of the memory cell cell 101. Hence, electrons are injected into the floating ate of the memory cell cell 101. The electrons thus injected are maintained even in the power-off state because floating gate is totally enclosed by an insulating substance.

In the erase operation, the threshold voltage of the memory cell cell 101 is set to approximately 2 V as follows. The control gate voltage Vcg as high as approximately −10 V is applied to the control gate of the cell cell 101. The drain of the cell cell 101 is set to the open state. The source voltage Vs of approximately 5 V is applied to the source of the cell cell 101. Thus, the electrons in the floating gate are drawn. The state in which the electrons have been drawn can be maintained even in the power off state because the floating gate is totally enclosed by the insulating substance.

The data read operation is carried out as follows. When a data read operation on the cell cell 101 takes place in the state in which the electrons have been drawn, a read select signal /RD_sel ("/" corresponds to "bar" attached above the symbol in FIG. 1 and denotes "active low") is set to a low level. Thus, the p-channel transistor 102 is turned ON. Simultaneously, the control gate voltage Vcg approximately equal to 3 V is applied to the control gate of the cell cell 101. At that time, the cell cell 101 has a threshold voltage of approximately equal to 2 V, and is thus ON. Thus, a current is pulled to the ground GND, and the node Nb is changed to the low level. As a result, a high-level signal is output to an output terminal OUT via an inverter 103.

When the data read operation takes place in the state in which the electrons have been injected, the read select signal /RD_sel is set to the low level. Simultaneously, the control gate voltage Vcg approximately equal to 3 V is applied to the control gate of the cell cell 101. At that time, the cell cell 101 is turned OFF because the cell cell 101 has a threshold voltage of approximately 5 V. The node Nb is switched to the high level. Thus, a low-level signal is output to the output terminal OUT via the inverter 103.

The conventional non-volatile semiconductor memory device having the above memory cell 101 has, in addition to the above-mentioned operations, the function of storing initial information concerning the device using the floating-gate type memory cell 101, that is, the non-volatile property. For example, the floating-gate type memory cell 101 can be utilized as a redundant memory cell used when a fault occurs. An access to a faulty cell is automatically switched to a redundant memory cell by referring to the information stored in the redundant information memory element.

When the memory cell 101 is utilized as the redundant information memory element, data is read from the conventional non-volatile semiconductor memory device by any of the following first through third methods. The first method is to read data while the control gate voltage Vcg equal to 3 V is always applied. The second method is to read data only when the control gate voltage Vcg equal to 3 V is applied as necessary. The third method is to read data by storing fixed information generated by a fuse element or the like which is an element having the function of physically breaking a connection such as a switch.

The conventional non-volatile semiconductor memory device is required to operate at a reduced voltage in order to suppress power consumption. Thus, there is a possibility that the power supply voltage Vcc may become lower than the control gate voltage Vcg. When such a situation occurs, the following problems are encountered.

When the first method is employed, the non-volatile semiconductor memory device needs a boost circuit which always boosts the power supply voltage Vcc to 3 V. Thus, the first method needs an increased chip area and consumes a large amount of power. Further, it takes a long time to completely boost the power supply voltage Vcc to 3 V after power on, so that data cannot be read soon.

When the second method is employed, the non-volatile semiconductor memory device needs a boost circuit which always boosts the power supply voltage Vcc to 3 V, and thus needs an increased chip area. Further, it takes a long time to completely boost the power supply voltage Vcc to 3 V from receipt of a data read command, that is, the time when the read select signal /RD_sel switches to the low level. Thus, data cannot be read soon. Furthermore, it takes another long time to completely boost the power supply voltage Vcc to 3 V after power on, so that data cannot be read soon.

When the third method is employed, a particular apparatus is needed to cut the fuse element by projecting a laser beam onto the fuse. Further, programming of data is no longer available once the fuse is cut.

SUMMARY OF THE INVENTION

It is a general object of the present invention to provide a non-volatile semiconductor memory device in which the above disadvantages are eliminated.

A more specific object of the present invention is to provide a non-volatile semiconductor memory device which consumes a reduce amount of power without increasing the circuit size and operates at a higher speed.

The above objects of the present invention are achieved by a non-volatile semiconductor memory device comprising: a first cell including a first floating-gate type transistor having a first threshold voltage; and a second cell including a second floating-gate type transistor having a second threshold voltage different from the first threshold voltage. Data is stored by a difference between a first current flowing in the first cell and a second current flowing in the second cell.

The above objects of the present invention are also achieved by a non-volatile semiconductor memory device comprising: a first cell including first and second floating-gate type transistors having a first threshold voltage; and a second cell including third and floating-gate type transistors having a second threshold voltage different from the first threshold voltage. Data is stored by a difference between a first current flowing in the first cell and a second current flowing in the second cell.

Yet another object of the present invention is to provide a non-volatile semiconductor memory device having the above configuration which is used to a redundant address memory circuit indicative of address information on a faulty memory cell in a memory cell array having non-volatile memory cells.

BRIEF DESCRIPTION OF THE DRAWINGS

Other objects, features and advantages of the present invention will become more apparent from the following detailed description when read in conjunction with the accompanying drawings, in which:

FIG. 6 is a diagram showing operations of the circuit shown in FIG. 5.

DESCRIPTION OF THE PREFERRED EMBODIMENTS

Figure 2:
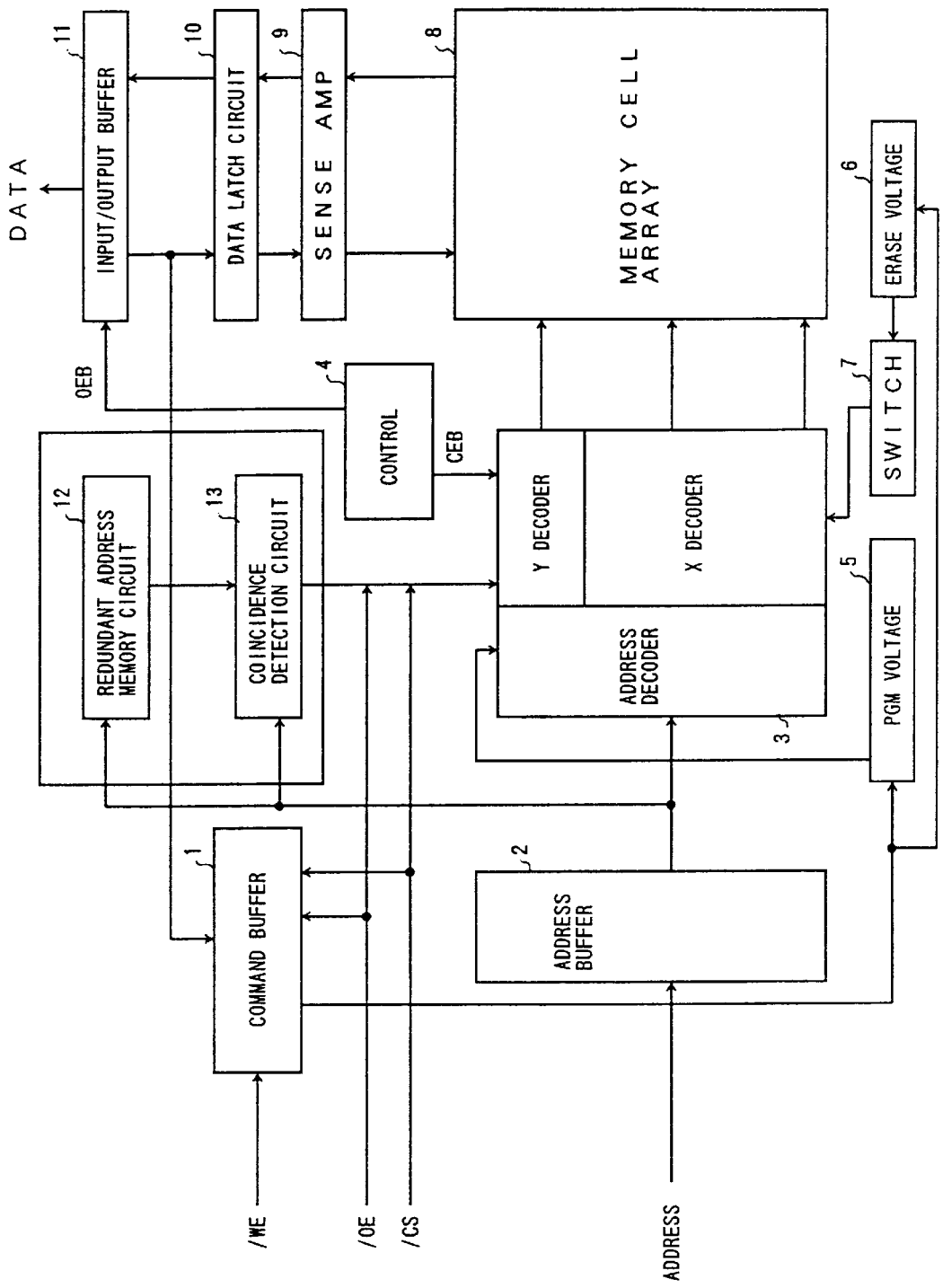
FIG. 2 is a block diagram of a flash memory according to an embodiment of the present invention.

FIG. 2 is a block diagram of a flash memory that is an electrically erasable and programmable read only memory device according to an embodiment of the present invention.

The flash memory shown in FIG. 2 includes a command buffer 1, an address buffer 2, an address decoder 3, a chip enable/output enable control circuit 4, programming (PGM) voltage generating circuit 5, an erase voltage generating circuit 6, a switch circuit 7, a memory cell array 8, a sense amplifier 9, a data latch circuit 10, and an input/output buffer 11. Further, the flash memory includes a redundant address memory circuit 12, and a coincidence detection circuit 13. The memory cell array 8 includes floating-gate type memory cells arranged in blocks. Voltages applied to the floating-gate type memory cells are controlled so that data reading, programming and erasing on the memory cells can be carried out.

Figure 1:
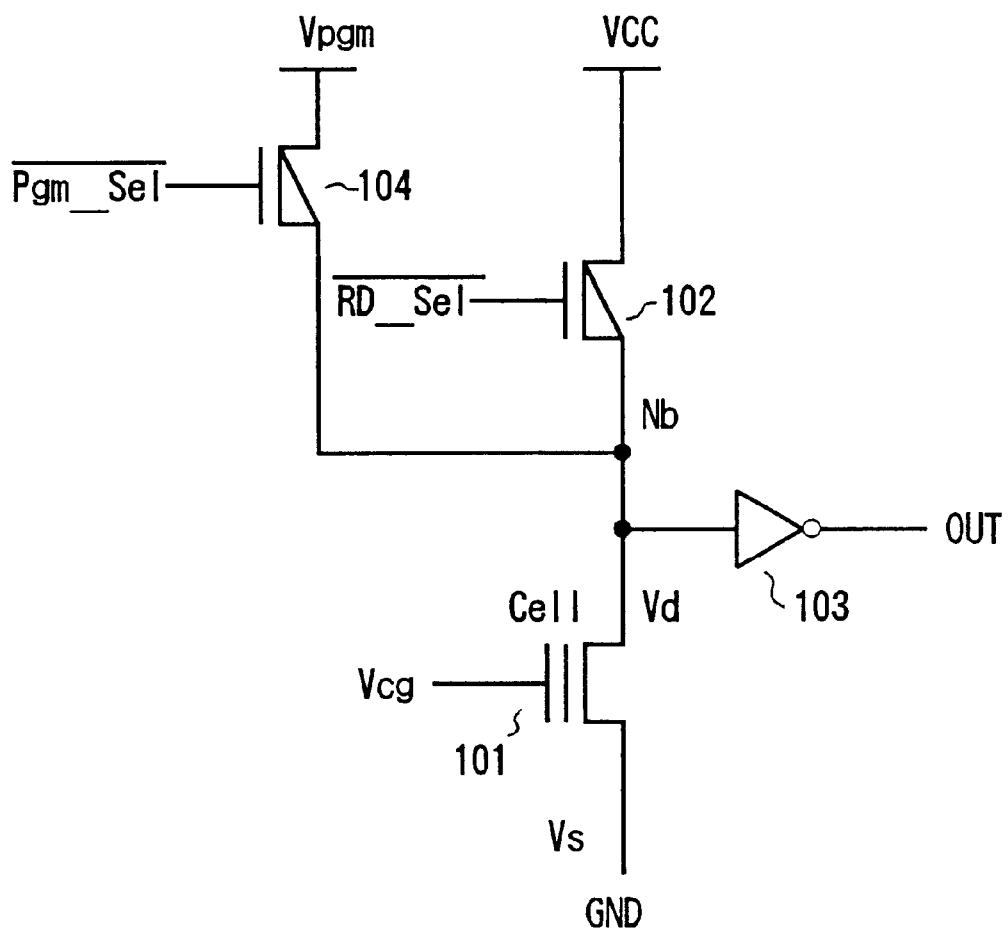
FIG. 1 is a circuit diagram of a conventional non-volatile semiconductor memory circuit.

The memory cell array 8 includes the same peripheral circuits as those shown in FIG. 1. A write enable signal /WE is at the low level at the time of data writing, and is at the high level at the time of data reading or at the normal time. A chip enable signal /CS switches to the low level at the time of data writing or reading. An output enable signal /OE switches to the low level at the time of data reading. The symbol "/" denotes the active-low signal.

The flash memory shown in FIG. 2 operates as follows.

When data stored in the memory cell array 8 is read, the write enable signal /WE switches to the high level, and the chip enable signal /CE and the output enable signal /OE switch to the low level. Further, an address signal indicative of data to be read is applied to the address buffer 2. The address decoder 3 receives the address signal via the address buffer 2, and decodes the received address signal. Then, read data read from the memory cell array 8 is sensed by the sense amplifier 9, and is output to the outside of the flash memory via the data latch circuit 10 and the input/output buffer 11. The chip enable/output enable control circuit 4 sets the input/output buffer 11 to an output state immediately after receiving the chip enable signal /CE and the output enable signal /OE.

When data is written into the memory cell array 8 in the programming/erase operation, the write enable signal /WE and the chip enable signal /EC switch to the low level, and the output enable signal /OE switches to the high level. Further, write data and the address signal are applied to the flash memory. The write data is held in the sense amplifier 9 via the input buffer 11 and the data latch circuit 10. Simultaneously, the address decoder 3 receives the address signal via the address buffer 2, and decodes the received address signal. Then, the write data held in the sense amplifier 9 is written into the memory cell of the memory cell array specified by the decoded address. The chip enable/output enable control circuit 4 sets the input/output enable control circuit 4 to an input state immediately after receiving the output enable signal /OE and the chip enable signal /CE.

When the electrons are injected into the floating gate of the non-volatile memory cell in the programming operation, the programming voltage generating circuit 5 generates a high voltage equal to, for example, 12 V or 21 V. When the electrons are drawn from the floating gate in the erase operation, the erase voltage generating circuit 6 generates a high voltage equal to, for example, −12 V or −21 V. The switch circuit 7 selects a block which should be subjected to erasing.

The redundant address memory circuit 12 includes floating-gate type memory cells, which functions as redundant information memory elements that store information such as initial information concerning the flash memory by the non-volatile property of the floating gate. In other words, the floating-gate type memory cells of the redundant address memory circuit 12 store information in a manner different from the manner of the floating-gate type memory cells of the memory cell array 8 shown in FIG. 1. For example, the memory cells of the redundant address memory circuit 12 are used as redundant address memory cells which indicate faulty memory cells in the memory cell array 8.

The coincidence detection circuit 13 compares the address information stored in the redundant address memory circuit 12 with the input address signal from the address buffer 2. If the input address from the address buffer 2 coincides with any one of the addresses programmed in the redundant address memory circuit 12, the coincidence detection circuit 13 outputs a coincidence detection signal to the address decoder 3, which automatically replaces the faulty memory cell in the memory cell array 8 indicated by the input address by a redundant memory cell provided in the memory cell array 8.

Figure 3:
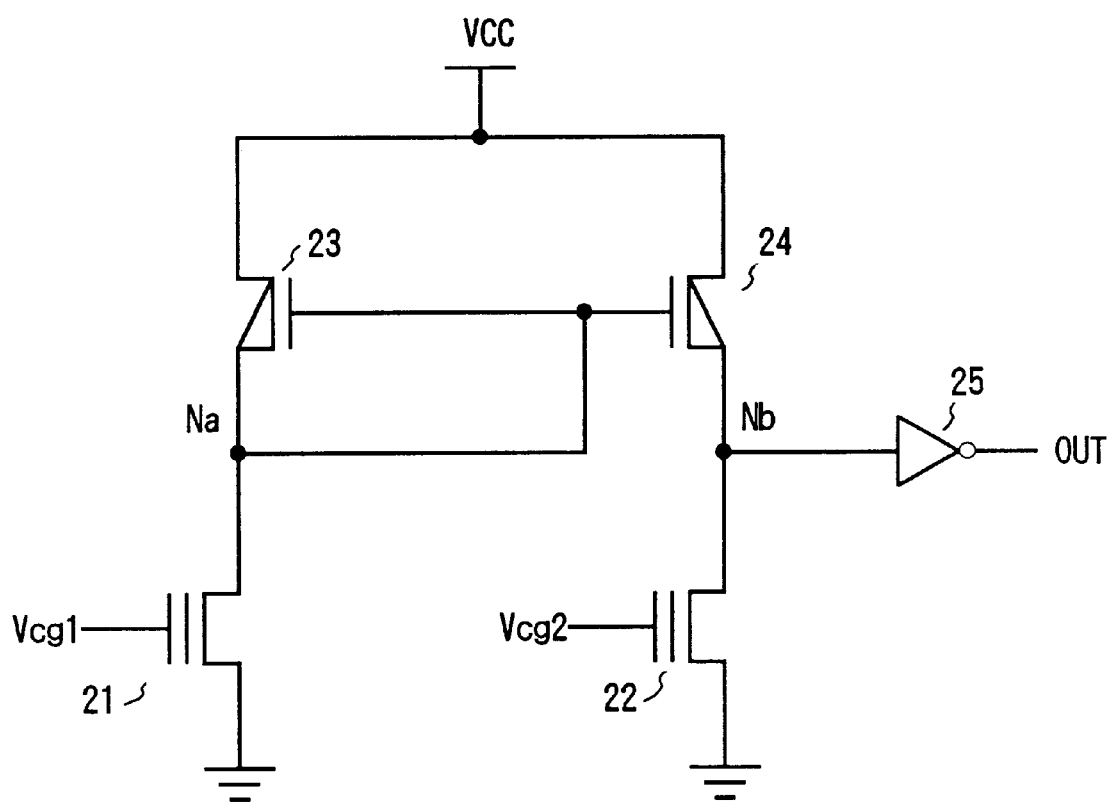
FIG. 3 is a circuit diagram of a part of a redundant address memory circuit shown in FIG. 2, in which the above part functions as a redundant information memory cell.

FIG. 3 shows a part of the internal circuit of the redundant address memory circuit 12. The circuit shown in FIG. 3 includes floating-gate type memory cells (transistors) 21 and 22, P-channel transistors 23 and 24, and an inverter 25. As shown in FIG. 3, the P-channel transistors 23 and 24 form a current-mirror circuit. The floating-gate type memory cells 21 and 22 are electrically erasable and programmable elements, and form a redundant information memory element. The threshold voltage of either one of the cells 21 and 22 is electrically erased and is thus set to a voltage lower than 0 V. The threshold voltage of the other one of the cells 21 and 22 is maintained in the normal state (which corresponds to a threshold voltage available in the initial state). Alternatively, the threshold voltage of the other one of the cells 21 and 22 is electrically programmed and is thus set to a voltage higher than the normal-state threshold voltage. Data stored in the redundant information memory element is defined by the difference between the currents respectively flowing in the cells 21 and 22. The control gates of the cells 21 and 22 are continuously supplied with a voltage of 0 V after power on. Thus, only one of the cells 21 and 22 is always ON, and information (data '1' or '0') defined by the redundant information memory element is always output.

Each of the cells 21 and 22 has the same structure of the conventional non-volatile memory element. That is, the polysilicon gate is embedded in the gate oxide film. The threshold voltage of the cell can be changed by injecting (programming) or drawing (erasing) electrons into or from the polysilicon (floating) gate by applying a high voltage of, for example, 12V or 21V to the control gate.

A description will now be given of the operation of the circuit shown in FIG. 3 carried out when the threshold voltages of the transistors 21 and 22 are approximately equal to 2 V in the normal (initial) state.

In the programming operation, a high voltage approximately equal to, for example, 20 V is applied to the control gate of one of the cells 21 and 22 to be programmed in order to raise the threshold voltage of the cell to be programmed to 5 V or higher. Thus, electrons are injected into the floating gate of the cell supplied with the above high voltage. The electrons thus injected cannot be escaped because the floating gate is completely enclosed by the insulating substance. Hence, the electrons are maintained even when the power supply is off.

In the erase operation, the control gate of one of the cells 21 and 22 to be erased are supplied with a high voltage approximately equal to, for example, −20 V in order to set the threshold voltage to a level lower than 0 V. Thus, the electrons in the floating gate are drawn therefrom. The state in which the electrons have been drawn is maintained even when the power supply is off because the floating gate is completely enclosed by the insulating substance.

In order to describe the read operation, a situation is assumed in which the electrons have been drawn from the floating gate of the cell 21 and the electrons have been injected into the floating gate of the cell 22 (or in the normal state). In this situation, when a power supply to the flash memory is turned on, the control gate voltages Vcg1 and Vcg2 equal to 0 V (ground level) are respectively applied to the control gates of the cells 21 and 22. At this time, since the threshold voltage of the cell 21 is set to a level lower than 0 V, the cell 21 is turned on. Since the threshold voltage of the cell 22 is set to a level equal to or higher than 5 V, the cell 22 is turned off. Hence, the node Na is changed to the low level, and the P-channel transistor 24 is turned ON. Thus, the node Nb is supplied with the power supply voltage Vcc and is changed to the high level. As a result, the low-level signal is output to the output terminal OUT from the inverter 25.

Another situation is assumed in which the electrons have been drawn from the floating gate of the cell 22 and electrons have been injected into the floating gate 21 (in the normal state). In the above situation, when the power supply to the flash memory is turned on, the control gate voltages Vcg1 and Vcg2 equal to 0 V (ground level) are respectively applied to the control gates of the cells 21 and 22. At this time, since the threshold voltage of the cell 22 is set to a level lower than 0 V, the cell 22 is turned on. Since the threshold voltage of the cell 21 is set to a level equal to or higher than 5 V, the cell 21 is turned off. Hence, the node Nb is switched to the low level, and the high-level signal is output to the output terminal OUT from the inverter 25.

As described above, when it is required to set the output terminal OUT to the low level, the electrons are drawn from the floating gate of the cell 21 beforehand, while the electrons are injected into the floating gate of the cell 22 beforehand. When it is required to set the output terminal OUT to the high level, the electrons are drawn from the floating gate of the cell 22, while the electrons are injected into the floating gate of the cell 21.

Figure 4:
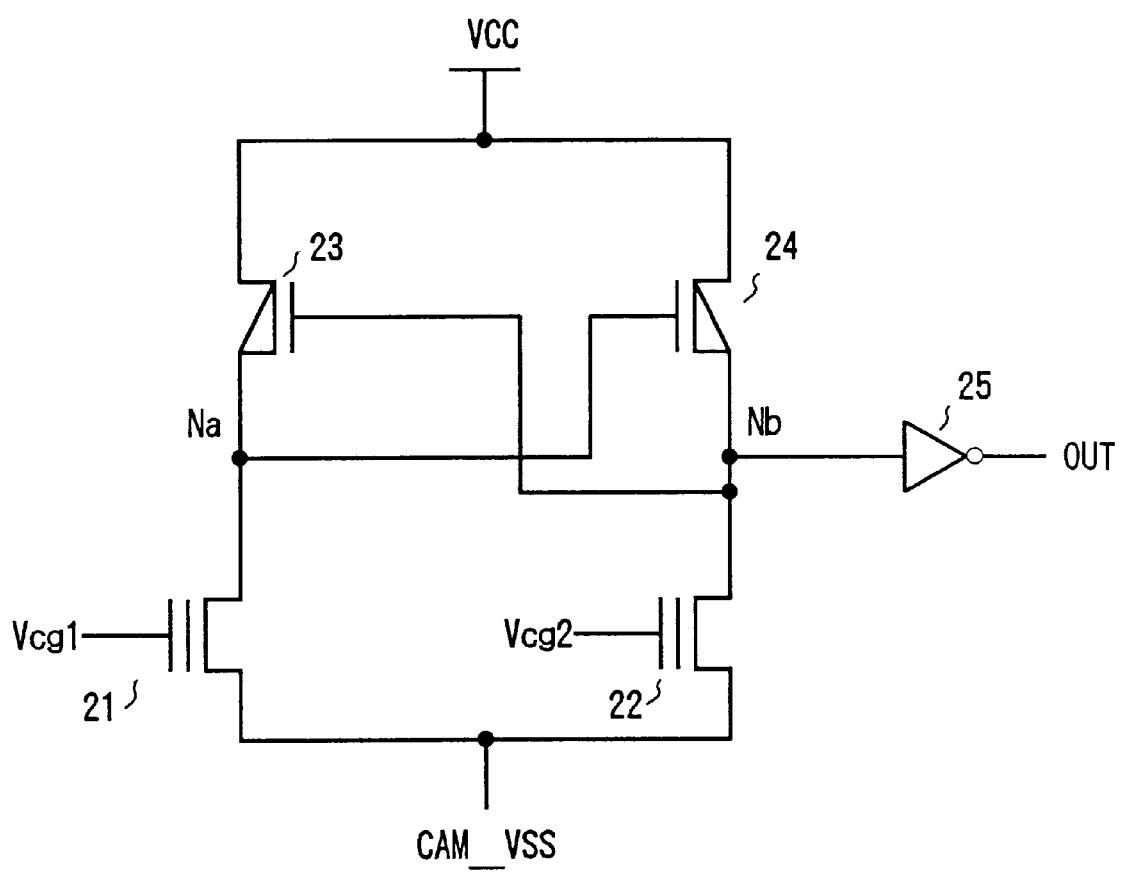
FIG. 4 is a circuit diagram of a circuit of a different type from that of the circuit shown in FIG. 3.

FIG. 4 is a circuit diagram of another peripheral circuit (a flip-flop type) including the floating-gate type cells 21 and 22. In FIG. 4, parts that are the same as those shown in FIG. 3 are given the same reference numbers.

A description will now be given of the operation of the circuit shown in FIG. 4 performed when the threshold voltages of the transistors 21 and 22 are approximately equal to 2 V in the normal (initial) state.

In the programming operation, the threshold voltage of one of the cells 21 and 22 to be programmed is increased to a level equal to 5 V or higher by the following manner. The control gate voltage equal to, for example, 10 V is applied to the control gate of the cell to be programmed, and a voltage as high as 5 V is applied to the drain of the cell to be programmed. A voltage CAM−Vss equal to 0 V is applied to the sources of the cells 21 and 22. Thus, electrons are injected into the floating gate of the cell to be programmed.

In the erase operation, the threshold voltage of one of the cells 21 and 22 to be erased is set to a level equal to or lower than 0 V in the following manner. A high voltage of, for example, −10 V is applied to the control gate of the cell to be erased. The drain of the cell to be erased is set to the floating state. The sources of the cells 21 and 22 are supplied with a voltage as high as 5 V. Thus, the electrons in the floating gate of the cell to be erased are drawn therefrom. The state in which the electrons have been drawn is maintained even when the power supply is off because the floating gate is completely enclosed by the insulating substance.

In order to describe the read operation, a situation is assumed in which the electrons have been drawn from the floating gate of the cell 21 and the electrons have been injected into the floating gate of the cell 22 (or in the normal state). In this situation, when a power supply to the flash memory is turned on, the control gate voltages Vcg1 and Vcg2 equal to 0 V (ground level) are respectively applied to the control gates of the cells 21 and 22. At this time, since the threshold voltage of the cell 21 is set to a level lower than 0 V, the cell 21 is turned on. In contrast, since the threshold voltage of the cell 22 is set to a level equal to or higher than 5 V, the cell 22 is turned off. Hence, the node Na is changed to the low level, and the P-channel transistor 24 is turned ON. Thus, the node Nb is supplied with the power supply voltage Vcc and is changed to the high level. As a result, the low-level signal is output to the output terminal OUT from the inverter 25.

Another situation is assumed in which the electrons have been drawn from the floating gate of the cell 22 and electrons have been injected into the floating gate 21 (in the normal state). In the above situation, when the power supply to the flash memory is turned on, the control gate voltages Vcg1 and Vcg2 equal to 0 V (ground level) are respectively applied to the control gates of the cells 21 and 22. At this time, since the threshold voltage of the cell 22 is set to a level lower than 0 V, the cell 22 is turned on. Since the threshold voltage of the cell 21 is set to a level equal to or higher than 5 V, the cell 21 is turned off. Hence, the node Nb is switched to the low level, and the P-channel transistor 23 is turned on. Thus, the node Na is switched to the high level. As a result, the high-level signal is output to the output terminal OUT from the inverter 25.

As described above, when it is required to set the output terminal OUT to the low level, the electrons are drawn from the floating gate of the cell 21 beforehand, while the electrons are injected into the floating gate of the cell 22 beforehand. When it is required to set the output terminal OUT to the high level, the electrons are drawn from the floating gate of the cell 22, while the electrons are injected into the floating gate of the cell 21.

The flash memory equipped with the circuit shown in FIG. 3 or FIG. 4 does not need the boost circuit which boosts the power supply voltage to 3 V. In other words, it is not necessary to boost the control gate voltage. Thus, both the circuit size and power consumption can be reduced. Further, since the threshold voltage is lower than 0 V, the floating-gate type cell is turned on even when the control gate voltage is equal to 0 V (ground level). Thus, it is possible to read data immediately after power on.

Figure 5:
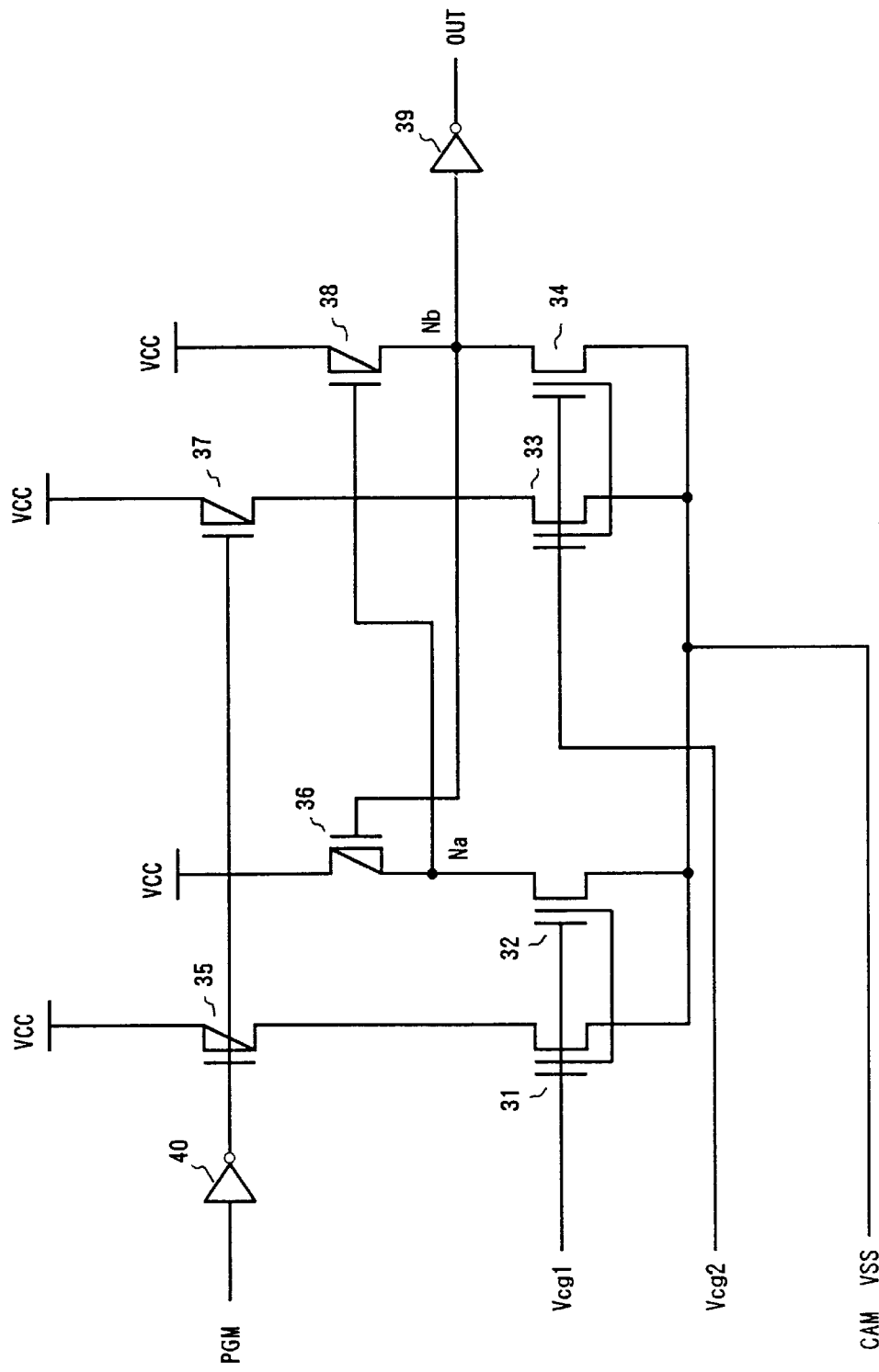
FIG. 5 is a circuit diagram of a redundant information memory cell having a yet another type.

FIG. 5 is a circuit diagram of yet another configuration of a part of the redundant address memory circuit 12. FIG. 6 shows states of the voltages in the data read operation, programming operation and erase operation of the circuit shown in FIG. 5. In FIG. 5, parts that are the same as those shown in FIGS. 3 and 4 are given the same reference numbers.

The circuit shown in FIG. 5 includes a flip-flop type circuit made up of floating-gate type cells (transistors) 31, 32, 33 and 34, which cells are electrically erasable and programmable elements and form a redundant information memory element. The cells 31 and 32 are paired, and the cells 33 and 34 are paired. Further, the circuit shown in FIG. 5 includes P-channel transistors 35, 36, 37 and 38, and inverters 39 and 40.

The threshold voltages of one of the two pairs of cells are electrically erased and are thus set to 0 V, and the threshold voltages of the other pair are maintained in the normal state (that is, the threshold voltages in the initial state). Alternatively, the threshold voltages of the other pair are electrically programmed and are thus set to a level equal to or higher than the normal-state threshold voltages. Data stored in the redundant information memory element is defined by the difference between the currents respectively flowing in the pairs of cells. Thus, a voltage of 0 V is continuously applied to the control gates of the cells 31–34 from the time of power on. As a result, one of the pairs of cells is always on, and information (data '1' or '0') defined by the redundant information memory element is always output.

A description will now be given of the operation of the circuit shown in FIG. 5 performed when the threshold voltages of the transistors 31–34 are approximately equal to 2 V in the normal (initial) state.

In the programming operation, the threshold voltages of the cells 31 and 32 or those of the cells 33 and 34 are increased to a level equal to or higher than 5 V. A high-level (H) signal PGM from the program voltage generating circuit 5 shown in FIG. 2 is applied to the inverter 40, and a high voltage Vcg1 or Vcg2 equal to, for example, 10 V is applied to the control gates of the cells 31 and 32 or the cells 33 and 34. The inverter 40 outputs the low-level signal, which turns on the transistors 35 and 37. Thus, electrons are injected into the floating gates of the pair of cells to be programmed. The floating gates of the transistors 31 and 32 are connected together and are simultaneously programmed. Similarly, the floating gates of the transistors 33 and 34 are connected together and are simultaneously programmed.

In the erase operation, the threshold voltages of the cells 31 and 32 or those of the cells 33 and 34 are set to a level lower than 0 V, the voltage CAM⁻Vss that is as high as 10 V is applied to the sources of the cells 31–34. Thus, the electrons stored in the floating gates of the cells to be erased are drawn therefrom. The state in which the electrons have been drawn is maintained even when the power supply to the flash memory is off. The electrons are simultaneously drawn from the floating gates of the cells 31 and 32 because the floating gates are connected together. Similarly, the electrons are simultaneously drawn from the floating gates of the cells 33 and 34 because the floating gates are connected together.

In order to describe the read operation, a situation is assumed in which the electrons have been drawn from the floating gate of the cells 31 and 32 and the electrons have been injected into the floating gate of the cells 33 and 34 (or in the normal state). In this situation, when a power supply to the flash memory is turned on, the control gate voltages Vcg1 and Vcg2 equal to 0 V (ground level) are respectively applied to the control gates of the cells 31 and 32 and those of the cells 33 and 34. At this time, since the threshold voltages of the cells 31 and 32 are set to a level lower than 0 V, the cells 31 and 32 are turned on. In contrast, since the threshold voltages of the cells 33 and 34 are set to a level equal to or higher than 5 V, the cells 33 and 34 are turned off. Hence, the node Na is changed to the low level because the voltage CAM⁻Vss is 0 V, and the P-channel transistor 38 is turned ON. Thus, the node Nb is supplied with the power supply voltage Vcc and is changed to the high level. As a result, the low-level signal is output to the output terminal OUT from the inverter 39.

Another situation is assumed in which the electrons have been drawn from the floating gates of the cells 33 and 34 and electrons have been injected into the floating gates 31 and 32 (in the normal state). In the above situation, when the power supply to the flash memory is turned on, the control gate voltages Vcg1 and Vcg2 equal to 0 V (ground level) are respectively applied to the control gates of the cells 31–34. At this time, since the threshold voltages of the cells 33 and 34 are set to a level lower than 0 V, the cells 33 and 34 turned on. In contrast, since the threshold voltages of the cells 31 and 32 are set to a level equal to or higher than 5 V, the cells 31 and 32 are turned off. Hence, the node Nb is switched to the low level because the voltage CAM⁻Vss is 0 V, and the P-channel transistor 36 is turned on. Thus, the node Na is switched to the high level. As a result, the high-level signal is output to the output terminal OUT from the inverter 39.

As described above, when it is required to set the output terminal OUT to the low level, the electrons are drawn from the floating gates of the cells 31 and 32 beforehand, while the electrons are injected into the floating gates of the cells 33 and 34 beforehand. When it is required to set the output terminal OUT to the high level, the electrons are drawn from the floating gates of the cells 33 and 34, while the electrons are injected into the floating gates of the cells 31 and 32.

The present invention is not limited to the specifically disclosed embodiments, and variations and modifications may be made without departing from the scope of the present invention.

What is claimed is:

1. A non-volatile semiconductor memory device comprising:
    a first cell including a first floating-gate type transistor having a first threshold voltage; and
    a second cell including a second floating-gate type transistor having a second threshold voltage different from the first threshold voltage,
    data being stored by a difference between a first current flowing in the first cell and a second current flowing in the second cell.

2. The non-volatile semiconductor memory device as claimed in claim 1, wherein the second threshold voltage is higher than the first threshold voltage.

3. The non-volatile semiconductor memory device as claimed in claim 1, wherein:
    the first threshold voltage is lower than a ground level; and
    the second threshold voltage is higher than the first threshold voltage.

4. The non-volatile semiconductor memory device as claimed in claim 1, wherein when the data is read, gates of the first and second floating-gate type transistors are set to a ground level.

5. The non-volatile semiconductor memory device as claimed in claim 1, wherein:
    sources of the first and second floating-gate type transistors are set to a ground level; and
    when the data is read, gates of the first and second floating-gate type transistors are set to the ground level.

6. The non-volatile semiconductor memory device as claimed in claim 1, further comprising a current-mirror circuit which is connected to drains of the first and second floating-gate type transistors.

7. The non-volatile semiconductor memory device as claimed in claim 6, wherein sources of the first and second floating-gate type transistors are set to a ground level.

8. The non-volatile semiconductor memory device as claimed in claim 1, further comprising:
    a third transistor having a source supplied with a power supply voltage, a drain, and a gate connected to said drain and a drain of the first floating-gate type transistor; and
    a fourth transistor having a source supplied with the power supply voltage, a drain connected to a drain of the second floating-gate type transistor, and a gate connected to the gate of the third transistor.

9. The non-volatile semiconductor memory device as claimed in claim 1, further comprising a flip-flop circuit including the first and second floating-gate type transistors.

10. The non-volatile semiconductor memory device as claimed in claim 1, further comprising:
    a third transistor having a source supplied with a power supply voltage, a gate connected to a drain of the second floating-gate type transistor, and a drain connected to a drain of the first floating-gate type transistor; and
    a fourth transistor having a source supplied with the power supply voltage, a gate connected to the drain of the first floating-gate type transistor, and a drain of the second floating-gate type transistor.

11. A non-volatile semiconductor memory device comprising:
    a first cell including first and second floating-gate type transistors having a first threshold voltage; and
    a second cell including third and floating-gate type transistors having a second threshold voltage different from the first threshold voltage,
    data being stored by a difference between a first current flowing in the first cell and a second current flowing in the second cell.

12. A non-volatile semiconductor memory device comprising:
    a memory cell array having non-volatile memory cells including redundant memory cells; and
    a redundant address memory circuit which stores information address information on a faulty cell in the memory cell array,
    said redundant address memory circuit comprising:
        a first cell including a first floating-gate type transistor having a first threshold voltage; and
        a second cell including a second floating-gate type transistor having a second threshold voltage different from the first threshold voltage,
        data being stored by a difference between a first current flowing in the first cell and a second current flowing in the second cell and being used to describe the address information.

13. A non-volatile semiconductor memory device comprising:
    a memory cell array having non-volatile memory cells including redundant memory cells; and
    a redundant address memory circuit which stores information address information on a faulty cell in the memory cell array,
    said redundant address memory circuit comprising:
        a first cell including first and second floating-gate type transistors having a first threshold voltage; and
        a second cell including third and floating-gate type transistors having a second threshold voltage different from the first threshold voltage,
        data being stored by a difference between a first current flowing in the first cell and a second current flowing in the second cell and being used to describe the address information.

* * * * *